(12) United States Patent  
Nakamura

(10) Patent No.: US 7,401,309 B2  
(45) Date of Patent: Jul. 15, 2008

(54) INTEGRATED CIRCUIT HIERARCHICAL DESIGN SYSTEM, INTEGRATED CIRCUIT HIERARCHICAL DESIGN PROGRAM AND INTEGRATED CIRCUIT HIERARCHICAL DESIGN METHOD

(75) Inventor: Yuichi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 79 days.

(21) Appl. No.: 11/176,211

(22) Filed: Jul. 8, 2005

(65) Prior Publication Data

US 2006/0006473 A1     Jan. 12, 2006

(30) Foreign Application Priority Data

Jul. 9, 2004 (JP) ............................. 2004-202554

(51) Int. Cl.
*G06F 17/50* (2006.01)
*G06F 9/45* (2006.01)

(52) U.S. Cl. .................. 716/6; 716/1; 716/4; 716/5
(58) Field of Classification Search ............... 716/1–10, 716/18
See application file for complete search history.

(56) References Cited

U.S. PATENT DOCUMENTS

| | | | | | |
|---|---|---|---|---|---|
| 5,452,228 | A | * | 9/1995 | Arakawa et al. | 716/6 |
| 5,475,607 | A | * | 12/1995 | Apte et al. | 716/10 |
| 5,600,568 | A | * | 2/1997 | Iwakura et al. | 716/6 |
| 5,778,216 | A | * | 7/1998 | Venkatesh | 713/503 |
| 5,790,830 | A | * | 8/1998 | Segal | 706/6 |
| 5,831,869 | A | * | 11/1998 | Ellis et al. | 716/6 |
| 5,859,776 | A | * | 1/1999 | Sato et al. | 700/121 |
| 5,883,808 | A | * | 3/1999 | Kawarabayashi | 716/2 |
| 6,295,636 | B1 | * | 9/2001 | Dupenloup | 716/18 |
| 6,336,205 | B1 | * | 1/2002 | Kurokawa et al. | 716/2 |
| 6,430,726 | B1 | * | 8/2002 | Nakamura | 716/2 |
| 6,457,166 | B1 | * | 9/2002 | Shoyama | 716/18 |
| 6,606,730 | B1 | * | 8/2003 | Yoshimaru et al. | 716/2 |
| 6,609,232 | B2 | * | 8/2003 | Hirotsu et al. | 716/6 |
| 6,637,009 | B2 | * | 10/2003 | Narita | 716/2 |
| 6,678,871 | B2 | * | 1/2004 | Takeyama et al. | 716/6 |

FOREIGN PATENT DOCUMENTS

| | | |
|---|---|---|
| JP | 05-258006 A | 10/1993 |
| JP | 06-076012 A | 3/1994 |
| JP | 2002-083002 A | 3/2002 |

OTHER PUBLICATIONS

Itaru Sakurai: Basis of Digital Design by HDL, pp. 128-129, Figs. 5-18, Techno-press.

\* cited by examiner

*Primary Examiner*—Jack Chiang
*Assistant Examiner*—Nghia M Doan
(74) *Attorney, Agent, or Firm*—Sughrue Mion, PLLC

(57) ABSTRACT

An integrated circuit hierarchical design system for optimizing a circuit locating between flip-flops included in a lower layer through a higher layer among layers forming an integrated circuit, which shifts a layer section as a boundary between the higher layer and the lower layer that locates on the circuit to the vicinity of a connection portion between the flip-flop and the circuit to include the circuit in either the higher layer or lower layer, thereby eliminating the need of distributing propagation delays of the circuit.

18 Claims, 9 Drawing Sheets

INTEGRATED CIRCUIT HIERARCHICAL DESIGN SYSTEM, INTEGRATED CIRCUIT HIERARCHICAL DESIGN PROGRAM AND INTEGRATED CIRCUIT HIERARCHICAL DESIGN METHOD

BACKGROUNDS OF THE INVENTION

1. Field of the Invention

The present invention relates to optimization of integrated circuit hierarchical design and, more particularly, an integrated circuit hierarchical design system and an integrated circuit hierarchical design program which eliminate the need of distribution of propagation delays on a path between flip-flops connecting layers.

2. Description of the Related Art

When composing a large-scale integrated circuit including layer blocks, optimization is conducted while maintaining a layered structure. In the optimization, delays of a signal propagating between flip-flops which determine an operating frequency of the integrated circuit is analyzed.

In this case, because designing is made for each layer, with a signal propagating over a plurality of layers, its signal propagation delays should be divided for each layer, which requires calculation of propagation delays whose precision is hard to be obtained and whose execution relies on prediction.

Examples of methods for solving such a problem are recited, for example, in Japanese Patent Laying-Open (Kokai) No. 05-258006 (Literature 1), Japanese Patent Laying-Open (Kokai) No. 06-76012 (Literature 2), Japanese Patent Laying-Open (Kokai) No. 2000-83002 (Literature 3) and "Itaru Sakurai: Basis of Digital Design by HDL, pp. 128-129, FIGS. 5-18, Techno-press" (Literature 4).

The method disclosed in Literature 1 distributes delays of a signal propagating between layers, with timing between layers defined by a time storage means. According to the method of Literature 1, design is made after setting time when a signal passes between the respective layers. More specifically, by defining timing of a higher layer at a time point when a lower layer is designed, a problem derived from a lack of coincidence in timing with the design of the lower layer made at an early stage of the designing will be solved at a time of designing the higher layer which is made at a later stage of the designing.

The method recited in Literature 2 distributes delays of a signal propagating between layers by using hierarchical development reference data.

On the other hand, the method recited in Literature 3 changes a layered structure by extracting a flip-flop and making a section by a layer changing unit to have an input of the flip-flop reside in the vicinity of the section of a layer such that with respect to a signal propagating between the layers, there exists no path that fails to pass through the flip-flop.

According to the method in Literature 3, in a case of a path leading to an output terminal from an input terminal without passing through a flip-flop, optimization processing can be executed without requiring special processing such as hierarchy destruction and constraint value regeneration.

FIG. 9 shows an example of optimization disclosed in the method of Literature 3.

Literature 4 points out that because out of signals propagating between flip-flops which determine an operating frequency of the integrated circuit, with respect to a signal propagating over the layers whose signal propagation delay value is hard to be minimized, in particular, signal propagation between flip-flops is hierarchically designed, signal propagation from an output flip-flop to a layer exit, from the layer exit to a layer entrance and from the layer entrance to an input flip-flop should be divisionally handled.

Furthermore, Literature 4 recommends a design rule that a register formed of a flip-flop should be placed at an input/output of a block without fail in order to improve external estimation precision.

The above-described conventional techniques all have the following shortcomings.

The method disclosed in Literature 1 distributes delays of a signal propagating between layers, with timing between layers defined by a time storage means. The method in Literature 1 therefore fails to solve the problem that with respect to a signal propagating between divided layers, signal propagation delays need to be divided into the plural.

In addition, the method in Literature 1 aims at solving a problem derived from design of a lower layer at a time when a higher layer is designed after finishing designing of the lower layer and not at solving the problem that signal propagation delays need to be divided into the plural.

Similarly, neither aims the method of Literature 2 at eliminating the need of dividing signal propagation delays into the plural.

On the other hand, by changing a layered structure by making a section, the method disclosed in Literature 3 enables optimization processing to be executed without special processing such as hierarchy destruction which changes a layered structure and constraint value regeneration when there exists a path leading to an output terminal from an input terminal without passing through a flip-flop.

The method in Literature 3 which changes a layered structure aims at avoiding a signal propagating between flip-flops that passes through a layer and fails to eliminate the need of dividing signal propagation delays into the plural because even after changing the layered structure, there remains at least a path leading from a flip-flop to a layer exit and a path leading from the layer exit to a layer entrance as shown in FIG. 9 to inevitably require distribution of delays on these two paths.

The literature 4 recommends a design rule that a register formed of a flip-flop should be placed at an input/output of a block without fail in order to improve external estimation precision, while it discloses no specific method therefor to fail to eliminate the need of dividing signal propagation delays into the plural.

SUMMARY OF THE INVENTION

A first object of the present invention is to provide an integrated circuit hierarchical design system and an integrated circuit hierarchical design program which solve the above-described shortcomings of the conventional art and which eliminate the need of distributing propagation delays of a path between flip-flops which propagates between layers at the time of optimizing an integrated circuit having a layered structure by moving a layer section.

A second object of the present invention is to provide an integrated circuit hierarchical design system and an integrated circuit hierarchical design program which minimize shift of a circuit to the outside of a layer following shift of a layer section.

A third object of the present invention is to provide an integrated circuit hierarchical design system and an integrated circuit hierarchical design program in which a circuit structure modification history is stored to facilitate delay verification and logic verification when changing a section of the layered structure.

The present invention aiming at attaining the above-described objects is an integrated circuit hierarchical design system for optimizing a circuit locating between flip-flops contained in a lower layer through a higher layer out of layers forming an integrated circuit, which moves a layer section as a boundary between the higher layer and the lower layer that locates on the circuit to the vicinity of a connection portion between the flip-flop and the circuit to include the circuit in either the higher layer or the lower layer, thereby eliminating the need of distributing propagation delays of the circuit.

According to the present invention, first, extract a circuit locating between flip-flops contained in a lower layer. Next, with respect to the extracted circuit, specify a layer section as a boundary between the lower layer and a higher layer which locates on the circuit. When the circuit locating between flip-flops contained in the lower layer enters, from one lower layer, a higher layer and other lower layer, there exist two layer sections locating on the circuit. With respect to each of the two layer sections, specify location on the circuit and when the position of the layer section on the circuit is in the vicinity of the connection portion between the flip-flop and the circuit, shift of the layer section is unnecessary.

When the position of the layer section on the circuit is not in the vicinity of the connection portion between the flip-flop and the circuit, shift the layer section to the connection portion between the circuit and the flip-flop. This arrangement makes the circuit included in three layers, the one lower layer, the higher layer and the other lower layer, before shifting of the layer section be included only in one higher layer after shifting of the layer section. As a result, analysis of propagation delays of the circuit unit, which should be divisionally executed for each of the above-described one lower layer, higher layer and other lower layer before the shifting of the layer section, can be executed in the lump for the higher layer after the shift of the layer section, thereby eliminating the need of distribution of propagation delays of the circuit.

In the preferred construction, the integrated circuit hierarchical design system further comprises a circuit multiplexing unit which, for minimizing a rate of inclusion of said circuit in either said higher layer or lower layer after said shift of said layer section, inserts a multiplexing circuit as a copy of the circuit while keeping circuit logic be equivalent.

In another preferred construction, the integrated circuit hierarchical design system further comprises a circuit multiplexing unit which, for minimizing a rate of inclusion of said circuit in either said higher layer or lower layer after said shift of said layer section, inserts a multiplexing circuit as a copy of the circuit while keeping circuit logic be equivalent, and a buffer insertion unit which inserts a buffer circuit that stores a name of said circuit or a position of said circuit in the layer at an input of said circuit when said circuit is a flip-flop.

In another preferred construction, a layer section locating on the side of a direction opposite to a signal propagation direction on the circuit locating between said flip-flops is shifted to the vicinity of an output of a flip-flop arranged on said opposite direction side.

In another preferred construction, a layer section locating on the side of a direction opposite to a signal propagation direction on the circuit locating between said flip-flops is shifted to the vicinity of an output of a flip-flop arranged on said opposite direction side, and a layer section locating on the signal propagation direction side on said circuit is shifted to the vicinity of an input of a flip-flop arranged on said signal propagation direction side.

In another preferred construction, the integrated circuit hierarchical design system comprises a unit which, when a flip-flop on the side of a direction opposite to a signal propagation direction included in said lower layer is connected to other flip-flop through other plurality of circuits than the circuit locating between said flip-flops to include both said plurality of circuits and said flip-flops in said lower layer and include a circuit which is branched from an output of any one of said plurality of circuits and connected in said higher layer, inserts a multiplexing circuit as a copy of said one circuit in between said one circuit and said branched and connected circuit, as well as shifts the position of said layer section to an input of said multiplexing circuit and changes the position of said branch to an input of said one circuit.

In another preferred construction, the integrated circuit hierarchical design system comprises a unit which, when a circuit which is branched from an output of said flip-flop and connected is included in said higher layer, inserts a multiplexing circuit as a copy of said flip-flop in between said flip-flop and said branched and connected circuit, as well as shifts the position of said layer section to an output of said multiplexing circuit and changes the position of said branch to an input of said flip-flop.

According to another aspect of the invention, an integrated circuit hierarchical design program executed on a computer to optimize a circuit locating between flip-flops included in a lower layer through a higher layer among layers forming an integrated circuit, which executes a function of shifting a layer section as a boundary between said higher layer and said lower layer which locates on said circuit to the vicinity of a connection portion between said flip-flop and said circuit to include said circuit in either said higher layer or lower layer.

According to a further aspect of the invention, an integrated circuit hierarchical design method of optimizing a circuit locating between flip-flops included in a lower layer through a higher layer among layers forming an integrated circuit, comprising the steps of shifting a layer section as a boundary between said higher layer and said lower layer which locates on said circuit to the vicinity of a connection portion between said flip-flop and said circuit, and including said circuit in either said higher layer or lower layer to eliminate the need of distributing propagation delays of said circuit.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

In the following, a preferred embodiment of the present invention will be detailed with reference to the drawings.

Figure 1:
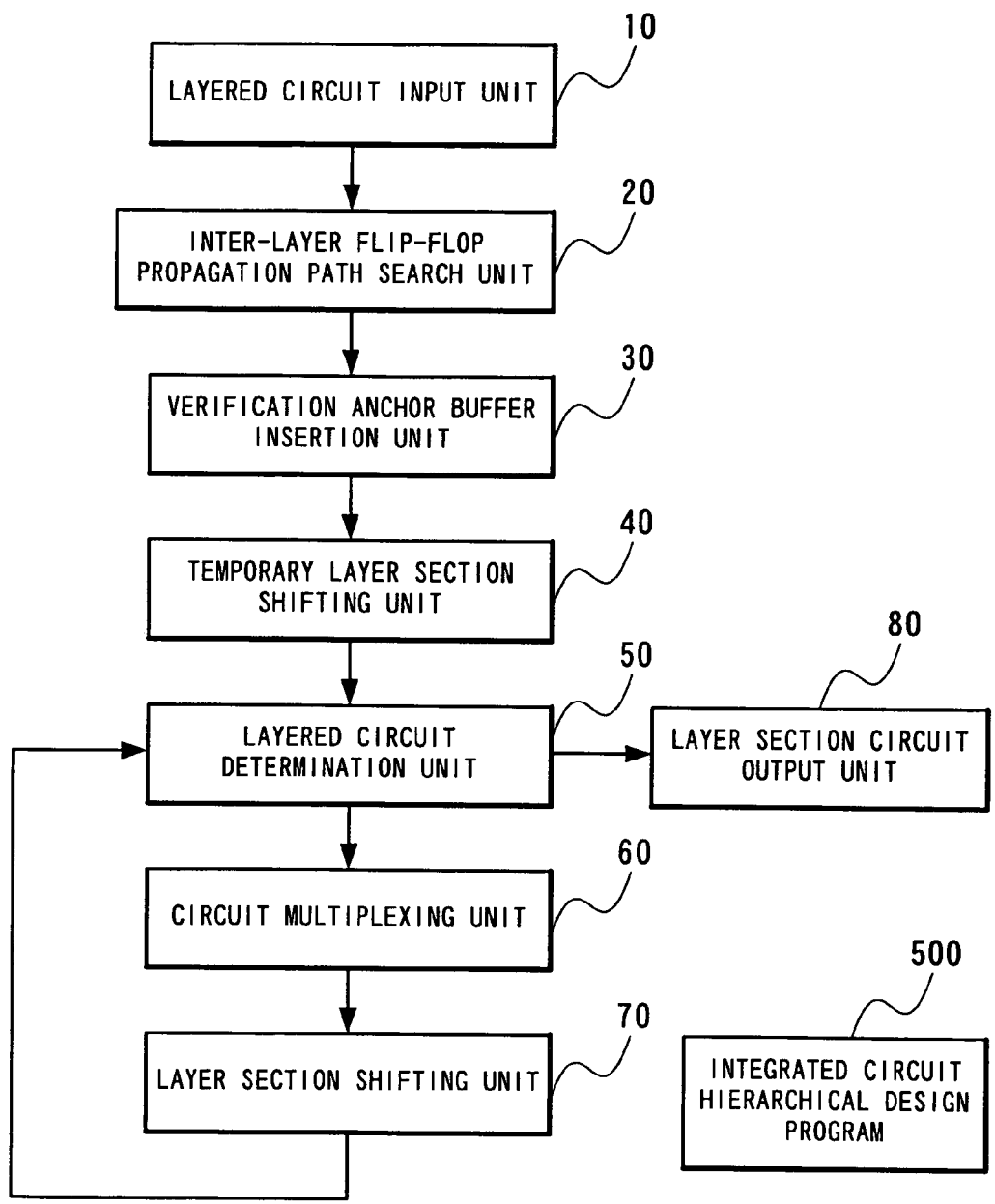
FIG. 1 is a block diagram showing a structure of an integrated circuit hierarchical design system according to an embodiment of the present invention.

FIG. 1 is a block diagram showing a structure of an integrated circuit hierarchical design system according to the present embodiment.

With reference to FIG. 1, the integrated circuit hierarchical design system according to the present embodiment includes a layered circuit input unit 10, an inter-layer flip-flop (FF) propagation path search unit 20, a verification anchor buffer insertion unit 30, a temporary layer section shifting unit 40, a layered circuit determination unit 50, a circuit multiplexing unit 60, a layer section shifting unit 70 and a layer section circuit output unit 80.

The layered circuit input unit 10 is capable of inputting a circuit which is formed of a plurality of lower layer block circuits and circuits connecting these lower layer block circuits and whose delay is to be analyzed.

The inter-layer flip-flop propagation path search unit 20 is capable of searching for a propagation signal path between flip-flops in different layers.

The verification anchor buffer insertion unit 30 is capable of inserting a buffer for storing a position of a flip-flop as a key parameter at the time of timing verification and logic verification in the vicinity of an input of the flip-flop.

The temporary layer section shifting unit 40 is capable of temporarily shifting a layer section to the vicinity of an input or an output of a flip-flop with respect to each inter-layer flip-flop propagation signal path.

The layered circuit determination unit 50 determines whether a circuit scale in a layer is larger than a circuit scale set in advance and when determining that it is larger, shifts the processing to the layer section circuit output unit 80 and otherwise, shifts the processing to the circuit multiplexing unit 60.

The circuit multiplexing unit 60 is capable of copying a circuit while keeping circuit logic be equivalent to insert a multiplexing circuit in order to minimize a rate of a circuit which goes out of a layer as a result of shifting of a layer section.

The layer section shifting unit 70 is capable of shifting, with a multiplexed circuit as a target, a layer section to the vicinity of an input or an output of a flip-flop with respect to each inter-layer flip-flop propagation signal path.

The layer section circuit output unit 80 is capable of outputting, with respect to all the inter-layer flip-flop propagation paths, a circuit which has a layer section shifted such that the layer section falls in the vicinity of an input or an output of a flip-flop.

Next, a flow of processing of the integrated circuit hierarchical design system according to the present embodiment will be described in brief.

Figure 2:
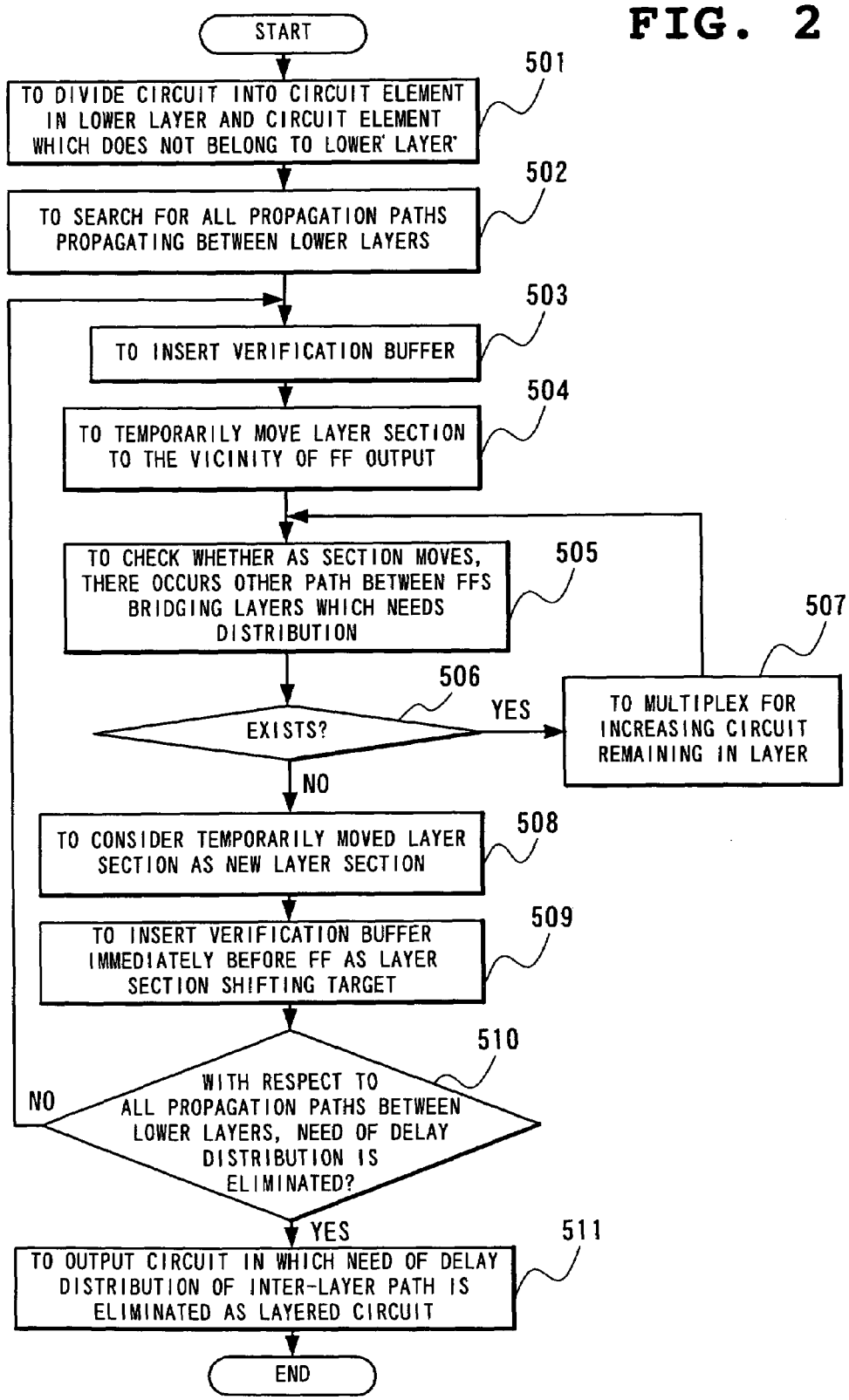
FIG. 2 is a flow chart showing a flow of processing of the integrated circuit hierarchical design system according to the embodiment of the present invention.

FIG. 2 is a flow chart showing a flow of processing of the integrated circuit hierarchical design system according to the present embodiment.

With reference to FIG. 2, first, the layered circuit input unit 10 receives input of a layered circuit divided into a circuit belonging to a lower layer and a circuit which does not belong to a lower layer (Step 501).

Next, with respect to the input layered circuit, the inter-layer flip-flop propagation path search unit 20 detects all paths between flip-flops bridging the lower layers (Step 502).

At this time, insert a verification buffer in advance by the verification anchor buffer insertion unit 30 (Step 503).

Next, the temporary layer section shifting unit 40 temporarily shifts a layer section to the vicinity of the flip-flop output (Step 504).

Here, the layered circuit determination unit 50 determines whether a circuit scale in the layer exceeds a circuit scale set in advance to determine whether circuit operation such as. multiplexing for further shifting the layer section is required or not (Step 505).

As a result of the determination, when circuit operation for moving the layer section is required (Step 506), shift the processing to the circuit multiplexing unit 60.

The circuit multiplexing unit 60 multiplexes the circuit while keeping the circuit logic be equivalent in order to shift the layer section moved by the temporary section shifting unit 40 for the purpose of increasing the circuit remaining in the layer (Step 507).

After multiplexing the circuit, return to Step 505.

Next, when operation for shifting the layer section is not required as a result of the determination (Step 506), consider the temporarily shifted layer section as a new layer section (Step 508).

Insert a buffer to the input side of the target FF by the layer section shifting unit 70 (Step 509).

Determine whether with respect to all the propagation paths between lower layers, the need of delay distribution is eliminated or not by the layered circuit determination unit 50 (Step 510).

As a result of the determination, when the processing of the elimination is yet to be executed, return to Step 504.

When the determination finds that all the processing of the elimination has been executed, output the result by the layer section circuit output unit 80 (Step 511).

Next, with reference to FIG. 1, operation of the integrated circuit hierarchical design system according to the present embodiment will be detailed.

First, the layered circuit input unit 10 receives input of the plurality of layer block circuits and all the circuits connecting these layer block circuits. Here, the layer block is description replacing a lower layer.

Next, along each propagation path of a signal which propagates between layers of the input circuit, search for a flip-flop at the starting point, a signal propagation path and a flip-flop at the end point by the inter-layer flip-flop propagation path search unit 20.

In order to facilitate timing verification and logic verification which will be executed later, the verification anchor buffer insertion unit 30 which inserts an anchor buffer for storing a position of a flip-flop as of before shifting inserts a buffer with a dummy sign (an element for marking) in the vicinity of an input of the flip-flop. The verification anchor buffer insertion unit 30 applies, to the buffer, identification information which can define a name of a nearby flip-flop and a name of a layer to which the flip-flop belongs.

The foregoing arrangement enables a position of a flip-flop as of before shifting to be defined with ease even after the flip-flop is shifted.

Next, with respect to the input circuit, the temporary layer section shifting unit 40 shifts the layer section such that the layer section comes to the vicinity of the input or the output of the flip-flop with respect to all the inter-layer flip-flop propagation paths. Shift of the layer section by the temporary layer section shifting unit 40 is temporary shift before circuit multiplexing, which might not take the final position of the layer section.

The layered circuit determination unit 50 determines whether the scale of the circuit remaining in the layer exceeds the circuit scale set in advance and when the scale exceeds the set scale, shifts the processing to the layer section circuit output unit 80 and otherwise shifts the same to the circuit multiplexing unit 60.

In addition, in a case where the circuit scale fails to reach the given scale even if the circuit multiplexing unit 60 is applied a prescribed number of times, shift the processing to the layer section output unit 80.

Since with the section shifted by the temporary layer section shifting unit 40, there remains a very little circuit in the layer, the circuit multiplexing unit 60 multiplexes the circuit after the determination by the layered circuit determination unit 50 in order to increase the circuit remaining in the layer.

Thus, with respect to the partly multiplexed circuit, the section of the layer is newly moved by the layer section shifting unit 70 such that the vicinity of the input or the output of the flip-flop falls on the layer section. After the move, shift the processing to the layered circuit determination unit 50 to determine whether another multiplexing or the like is required.

Next, features of the above-described integrated circuit hierarchical design system will be described.

According to the integrated circuit hierarchical design system of the present invention, with respect to a circuit locating between flip-flops bridging layers, a layer section is moved to the vicinity of a connection portion between the flip-flop and the circuit by using the temporary layer section shifting unit 40 or the layer section shifting unit 70 to include the circuit in either a higher layer or a lower layer.

This eliminates, with respect to a propagation path between flip-flops bridging the layers, the need of adjustment of propagation delays in three path units, from the flip-flop to a layer exit, from the layer exit to a layer entrance and from the layer entrance to the flip-flop, so that adjustment is only required of one propagation delay from the layer exit to the layer entrance.

There occurs a case where the circuit remaining in the layer is extremely reduced as the layer section shifts. The circuit multiplexing unit 60 prevents the reduction by multiplexing. As an example, with some circuit, use of the temporary layer section shifting unit 40 will have only about 5% of the whole circuit remain in the layer. On the other hand, use of the circuit multiplexing unit 70 increases the circuit scale by 24% as a whole, while increasing the circuit remaining in the layer up to 80%.

Furthermore, although such shift of the layer section is expected to lead to multiplexing or shit of a flip-flop, thereby making logic verification or delay verification be difficult or complicated, since the buffer inserted by the verification anchor buffer insertion unit 30 stores a position of the flip-flop as of before the shift, the circuit can be verified at a state before shifting the flip-flop, resulting in facilitating verification.

Next, specific operation example according to the present embodiment will be described.

Figure 3:
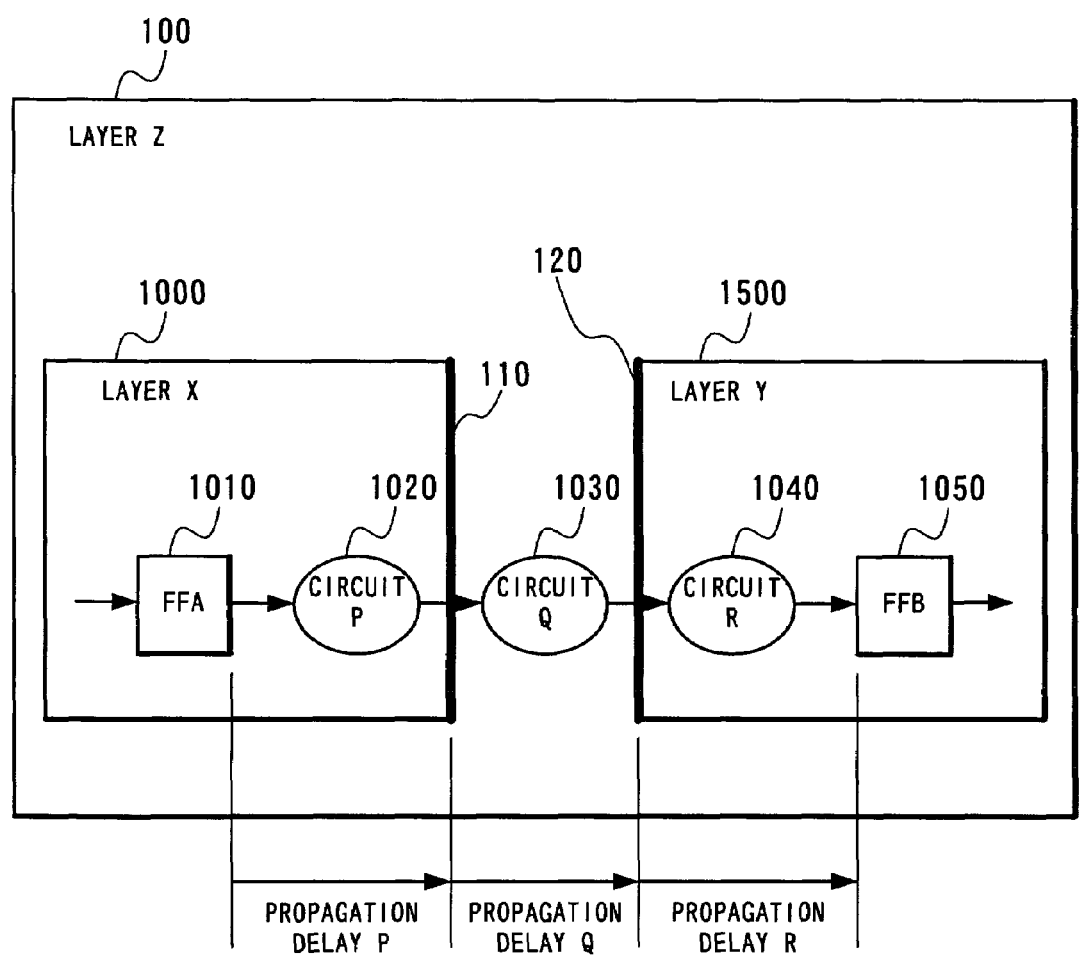
FIG. 3 is a diagram showing an integrated circuit having a layered structure for use in explaining the embodiment of the present invention.

FIG. 3 is a block diagram showing an integrated circuit having a layered structure for use in explaining the present embodiment.

With reference to FIG. 3, in a circuit having a layered structure which is applied to the layered circuit input unit 10, the inter-layer flip-flop propagation path search unit 20 searches for a path leading from an output of a flip-flop A (FFA) 1010 in a layer X1000 to an input of a flip-flop B1050 in a layer Y1500.

On this path, after being output from the flip-flop A1010 of the layer X1000 to go out of the layer x1000 through a layer section 110 via a circuit P1020, a signal enters the layer Y1500 at a layer section 120 via a circuit Q1030 belonging to a higher layer Z100 to propagate to the input of the flip-flop B1050 via a circuit R1040.

In a case of such a path, for designing a layer individually, constraints on delays between flip-flops should be divided into a propagation delay P of the circuit P1020, a propagation delay Q of the circuit Q1030 and a propagation delay R of the circuit R1040.

The divided delay constraints, however, are obtained based on prediction or on actual measurement, so that it is extremely difficult to accurately decide the division. It therefore happens a case where a large value might be assigned as constraint to a propagation delay P having a good margin (delay shorter than a target value) or a case where severe constraint is assigned to a propagation delay Q having a small margin.

Figure 4:
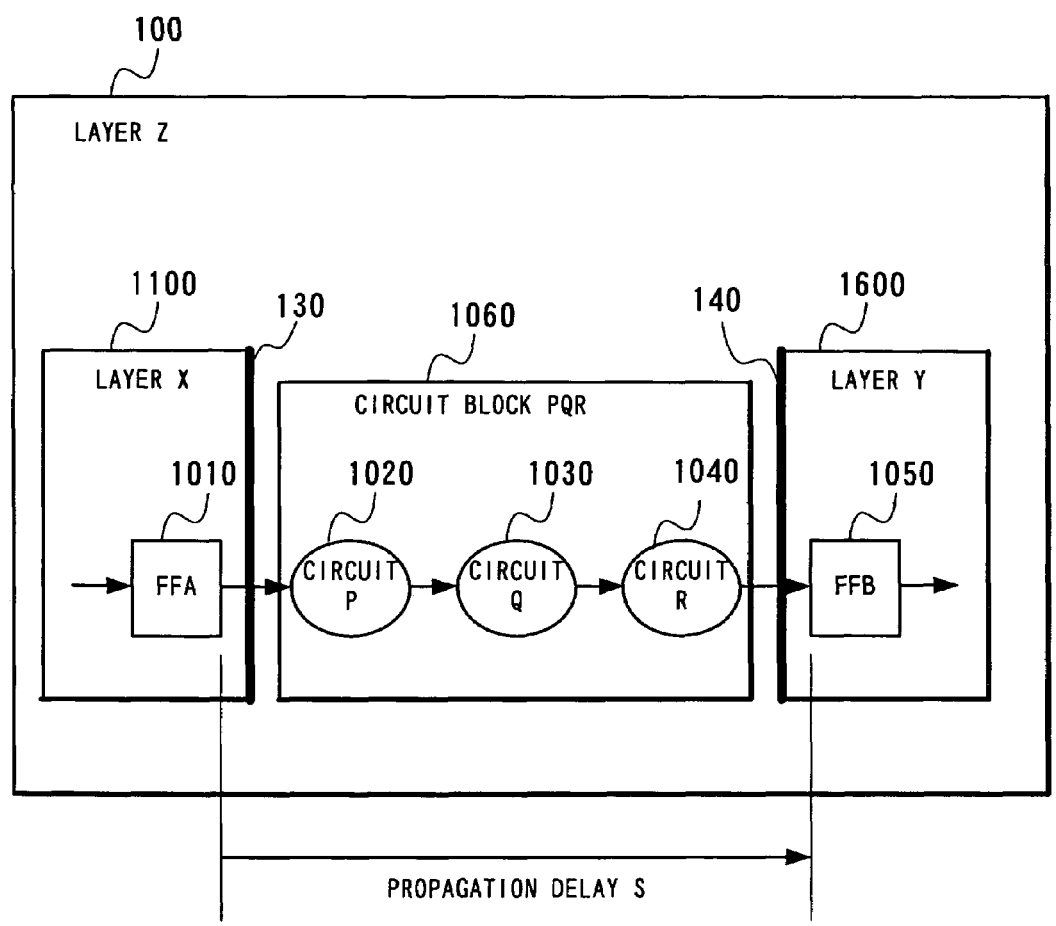
FIG. 4 is a diagram showing shift of a layer section for use in explaining the embodiment of the present invention.

FIG. 4 is a diagram showing shift of a layer section for use in explaining the present embodiment.

With reference to FIG. 4, when the layer section 110 of the layer X1000 shown in FIG. 3 is shifted to the vicinity of the output of the flip-flop A1010 to change into a layer section 130, the layer X1000 as of before shifting of the section is modified to a new layer X1100 to include the circuit P1020 in the layer Z100.

Similarly, when the layer section 120 of the layer Y1500 shown in FIG. 3 is shifted to the vicinity of the input of the flip-flop B1050 to change into a layer section 140, the layer X1500 as of before shifting of the section is modified to a new layer Y1600 to include the circuit R1040 in the layer Z100.

Thus, the circuit P1020, the circuit Q1030 and the circuit R1040 are included as a circuit block PQR1060 in one layer to eliminate the need of distribution of delay constraints as required in a conventional method. Such layer section shift is executed by the temporary layer section shifting unit 40 before the operation of multiplexing the circuit and by the layer section shifting unit 70 after the operation of multiplexing the circuit.

Such layer section shift, however, does not always bring a good result.

Figure 5:
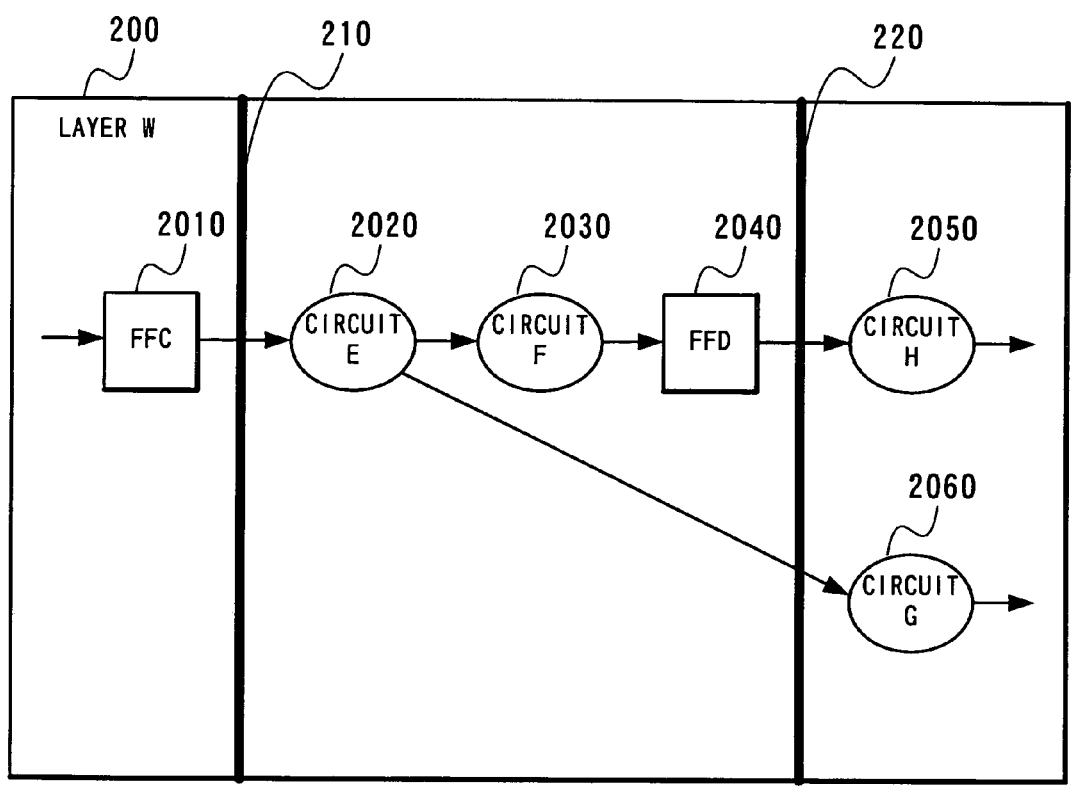
FIG. 5 is a diagram showing shift of a layer section for use in explaining the embodiment of the present invention.

FIG. 5 is a diagram showing shift of a layer section for use in explaining the present embodiment.

With reference to FIG. 5, circuits included in a layer W200 are a flip-flop C2010, a circuit E2020, a circuit F2030, a flip-flop D2040, a circuit H2050 and a circuit G2060. The circuit G2060 is branched from the output of the circuit E2020.

The layer W200 is equivalent to the layer X1000 shown in FIG. 3. The right end of the figure accordingly corresponds to the layer section 110 shown in FIG. 3.

Consideration will be given to application of the method shown in FIG. 4 to the circuits of the layer W200 shown in FIG. 5. In this case, possible is putting the circuit H2050 out to a higher layer and inserting a layer section U220 in the vicinity of the output of the flip-flop D2040. At this stage, a layer section V210 is yet to be inserted.

With respect to the flip-flop C2010, however, this positioning of the layer section U220 fails to have a layer section in the vicinity of the output of the flip-flop because the layer section U220 exists between the circuit E2020 and the circuit G2060.

Therefore, it is necessary to put the circuit E2020, the circuit F2030, the flip-flop D2040, the circuit H2050 and the circuit G2060 out of the layer W200 to shift a new layer section from the position of the layer section U220 to the layer section V210. Inserting the new layer section at the position of the layer section V210, however, results in placing all the circuits originally existing in the layer W200 excepting the flip-flop C2010 outside of the layer W200.

For preventing such a condition of placing almost all the circuits in the layer be outside of the layer, circuit multiplexing is employed.

Without the circuit G2060 branching from the circuit E2020, a circuit connected to the circuit H2050 at the position of the layer section U220 will be included in the layer Z100 shown in FIG. 3, so that the circuit connected to the output of the flip-flop D2040 is included in one layer to eliminate the need of propagation delay distribution at this state.

Figure 6:
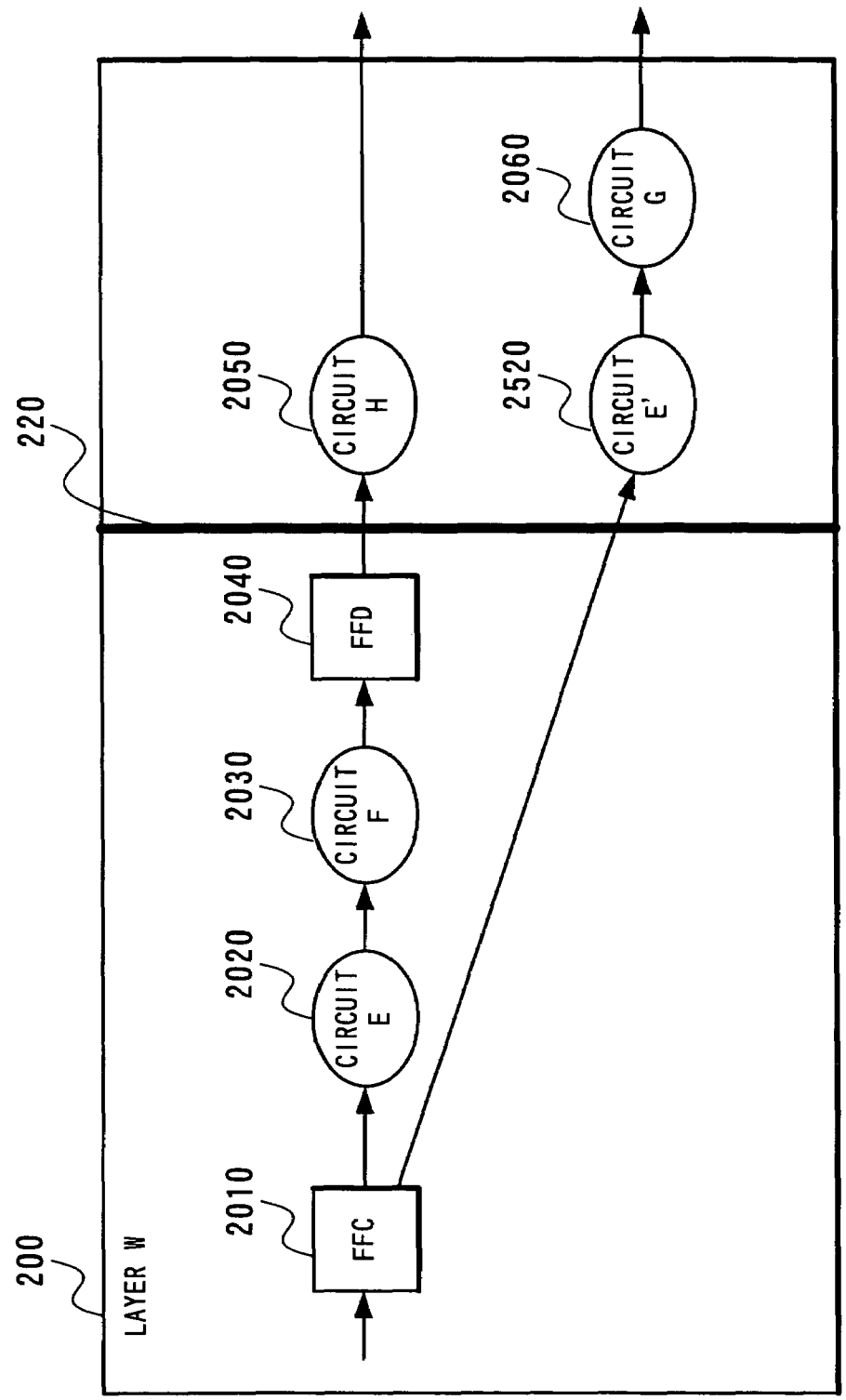
FIG. 6 is a diagram showing multiplexing of a circuit for use in explaining the embodiment of the present invention.

FIG. 6 is a diagram showing multiplexing of a circuit for use in explaining the present embodiment.

With reference to FIG. 6, a circuit E'2520 as a multiplexed copy of the circuit E2020 is generated. Circuit multiplexing is executed by the circuit multiplexing unit 60. Circuit multiplexing is conducted by inserting a circuit while keeping the circuit logic be equivalent.

Although inserting the circuit E'2520 as a copy of the circuit E2020 makes the output of the flip-flop C2010 connect to the layer section without through the circuit, the output of the flip-flop C2010 fails to locate in the vicinity of the layer section U220. Therefore, execute the following multiplexing.

Figure 7:
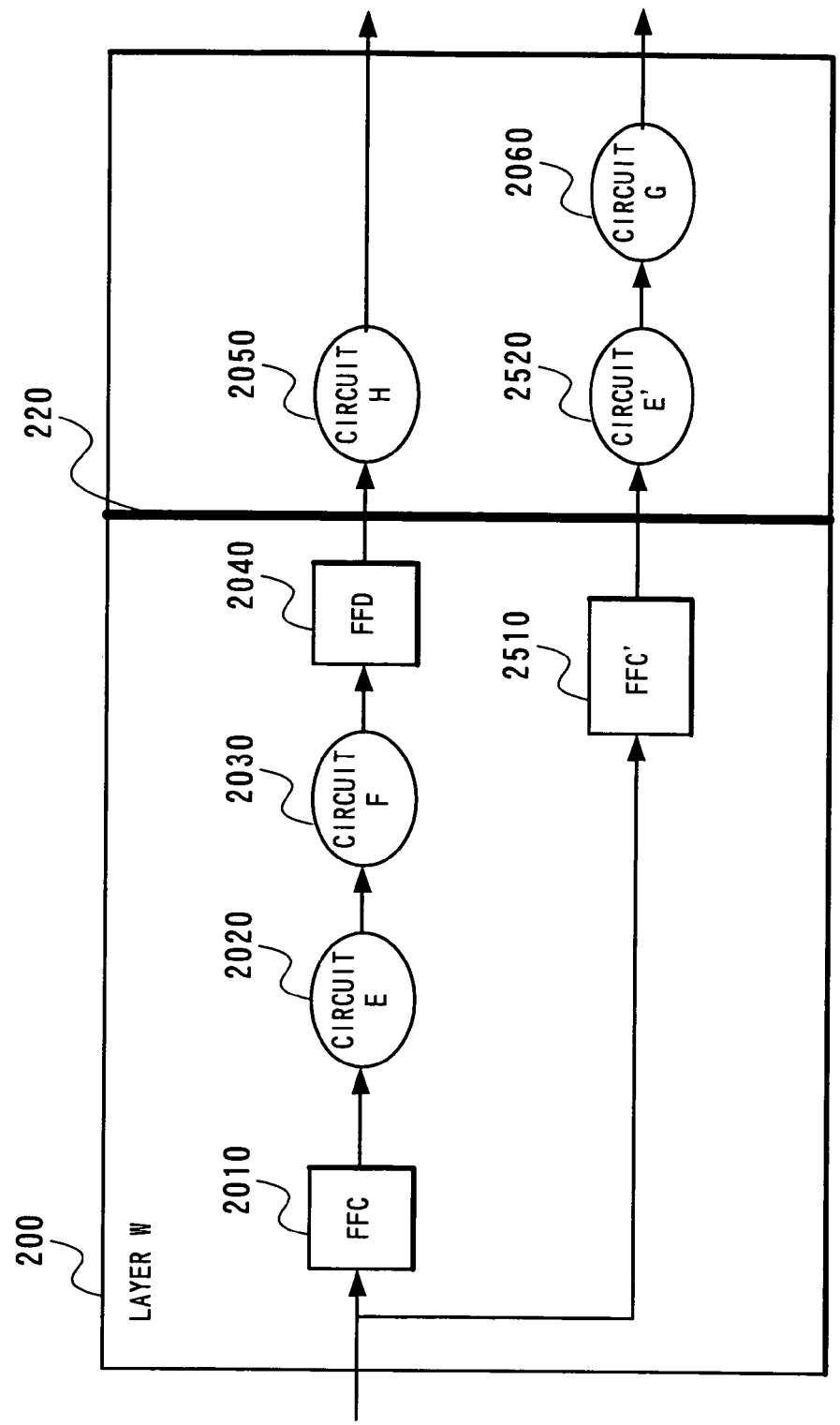
FIG. 7 is a diagram showing multiplexing of a circuit for use in explaining the embodiment of the present invention.

FIG. 7 is a diagram showing multiplexing of a circuit for use in explaining the present embodiment.

With reference to FIG. 7, by generating a flip-flop C'2510 as a multiplexed copy of the flip-flop C2010, a layered structured can be generated in which even with the layer section U220 at this position, the output of the flip-flop D2040 and the output of the flip-flop C2010 both locate in the vicinity of the layer.

Since shifting of a layer section by the layer section shifting unit 70 is followed by multiplexing of a flip-flop or shifting of a flip-flop between layers, the position of the flip-flop as of before shifting of the layer section is erased to cause difficulties at the time of logic verification and timing verification. To avoid such a problem, therefore, the verification anchor buffer insertion unit 30 inserts, at the input of the flip-flop, a buffer which indicates a position of the flip-flop as of before shifting of the section to store a name of the flip-flop and a layer position.

Figure 8:
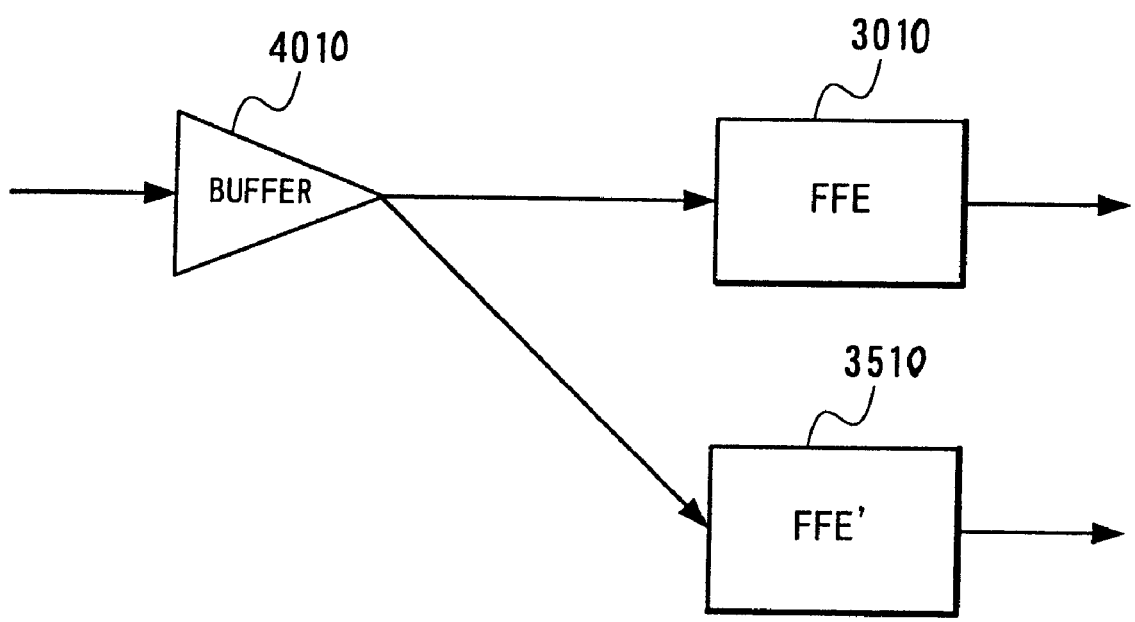
FIG. 8 is a diagram showing insertion of a buffer for use in explaining the embodiment of the present invention.
Figure 9:
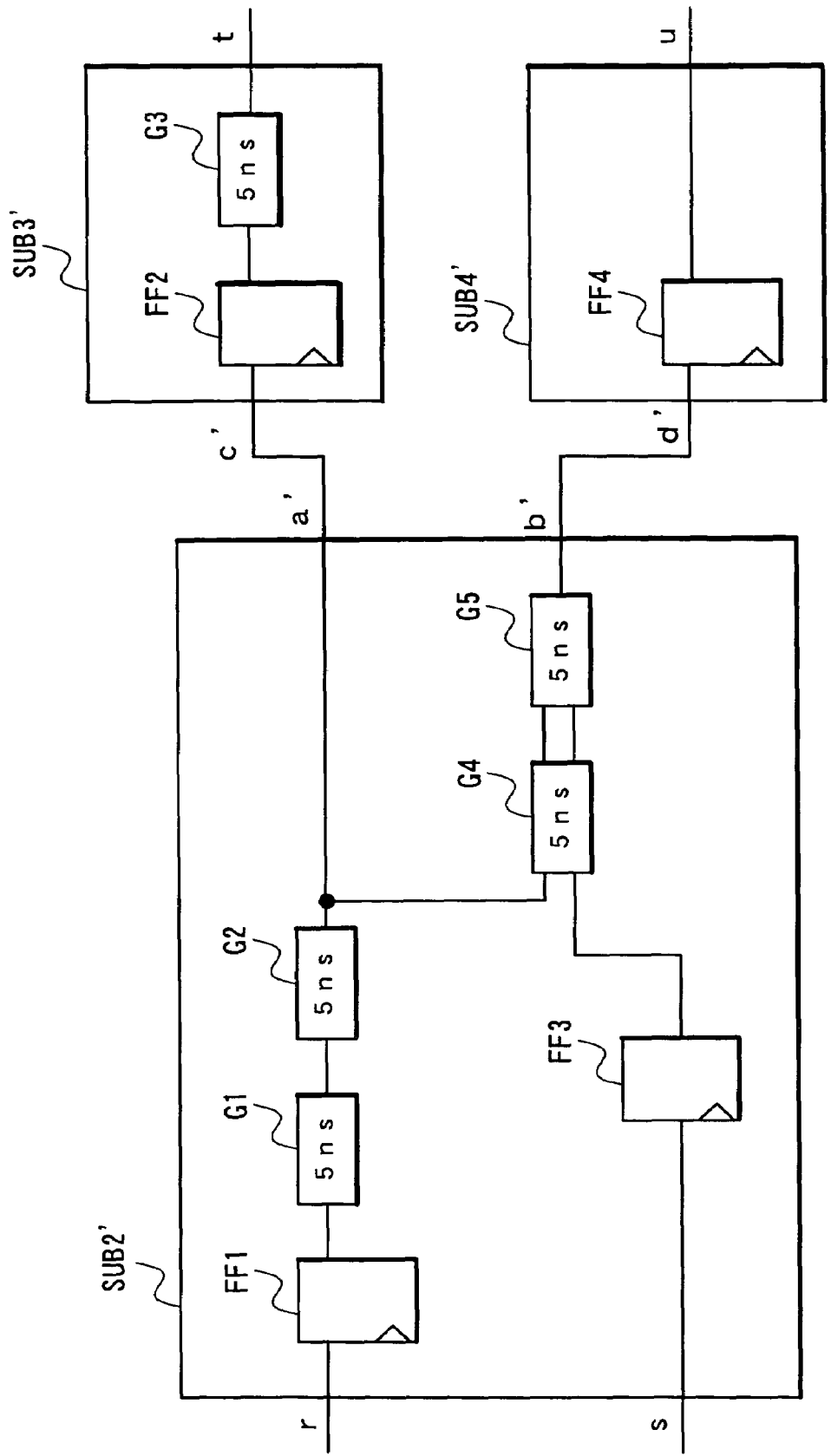
FIG. 9 is a diagram for use in explaining conventional art.

FIG. 8 is a diagram showing insertion of a buffer for use in explaining the present embodiment.

FIG. 8 shows that the verification anchor buffer insertion unit 30 inserts a buffer 4010 at the input of a flip-flop E3010, so that even when the flip-flop is multiplexed to generate a flip-flop E'3510 as a copy of the flip-flop E3010, the original position of the flip-flop is preserved by using the buffer 4010.

According to the foregoing-described embodiment, when optimizing a circuit locating between the flip-flop A1010 and the flip-flop B1050 arranged in the lower layer X1000 and the lower layer Y1500, respectively, shifting the layer sections 110 and 120 to the vicinity of the connection portion between the flip-flop A1010 and the flip-flop B1050 and the circuit to include the circuit in the higher layer Z100 eliminates the need of distributing propagation delays of the circuit connecting the flip-flops to enable optimization processing to be executed with ease and high precision.

Although in the above embodiment, the description has been made of a case where the need of distribution of propagation delays is eliminated by including a circuit locating between flip-flops of lower layers in a higher layer, making the circuit be included in other lower layer, in place of the higher layer, than the above-described lower layer enables the need of propagation delay distribution to be eliminated similarly to the above-described embodiment.

The integrated circuit hierarchical design system of the present invention has its operation realized not only by hardware but also in the form of software by running an integrated circuit hierarchical design program (application) 500 which executes the above-described respective units on an integrated circuit hierarchical design system as a computer processing device. The integrated circuit hierarchical design program 500 is stored in a magnetic disk, a semiconductor memory or other recording medium and loaded into the integrated circuit hierarchical design system from the recording medium to control operation of the system, thereby realizing the above-described respective functions.

Although the present invention has been described with respect to the preferred embodiment in the foregoing, the present invention is not necessarily limited to the above-described embodiment and can be realized in variations within the scope of the technical idea of the present invention.

According to the integrated circuit hierarchical design system and the integrated circuit hierarchical design program of the present invention, the following effects can be obtained.

First, in a case of optimizing, through a higher layer, a circuit locating between flip-flops included in lower layers among layers forming an integrated circuit, shifting a layer section as a boundary between the higher layer and the lower layer which locates on the circuit to the vicinity of a connection portion between the flip-flop and the circuit to include the circuit in either the higher layer or other lower layer results in eliminating the need of distribution of propagation delays of the circuit connecting the flip-flops, thereby enabling optimization processing to be executed with ease and high precision.

Secondly, circuit multiplexing while keeping circuit logic be equivalent enables shift of the circuit to the outside of a hierarchy which follows shift of a layer section to be minimized.

Thirdly, even when the position of the layer section is shifted, inserting a buffer for storing a position of a flip-flop enables verification of the circuit at a state as of before shifting of the flip-flop, thereby allowing delay verification and logic verification to be executed with high precision.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

The invention claimed is:

1. An integrated circuit hierarchical design system which executes verification of propagation delays in an integrated circuit which is formed of a plurality of layer blocks, comprising:
a unit which shifts a boundary of said layer blocks so that each circuit through which a signal path passes is included in one layer block, wherein the signal path is a signal path that passes through each circuit in said plurality of layers and connects between two flip-flops,
a unit which executes verification of propagation delays of each of said circuit in said one layer block; and
a unit which, when a flip-flop, on the side of a direction opposite to a signal propagation direction, included in a lower layer is connected to another flip-flop through a plurality of circuits other than the circuit located between said flip-flops, to include both said plurality of circuits and said flip-flops in said lower layer and include a circuit which is branched from an output of any one of said plurality of circuits and connected in a higher layer, inserts a multiplexing circuit as a copy of said one circuit between said flip-flops in between said one circuit and said branched and connected circuit, as well as shifts in the position of said boundary of said layer blocks to an input of said multiplexing circuit and changes the position of said branch to an input of said one circuit.

2. The integrated circuit hierarchical design system as set forth in claim 1, further comprising:
a buffer insertion unit which inserts a buffer circuit that stores a name of said circuit or a position of said circuit in the layer at an input of said circuit when said circuit is a flip-flop.

3. The integrated circuit hierarchical design system as set forth in claim 1, wherein
a boundary of said layer blocks located on the side of a direction opposite to a signal propagation direction positioned between said flip-flops is shifted to a vicinity of an output of a flip-flop arranged on said opposite direction side.

4. The integrated circuit hierarchical design system as set forth in claim 1, wherein
a first boundary of said layer blocks located on the side of a direction opposite to a signal propagation direction positioned between said flip-flops is shifted to a vicinity of an output of a flip-flop arranged on said opposite direction side, and
a second boundary of said layer blocks located on the signal propagation direction side is shifted to a vicinity of an input of a flip-flop arranged on said signal propagation direction side.

5. The integrated circuit hierarchical design system as set forth in claim 1, comprising:
a unit which, when a circuit which is branched from an output of said flip-flop and connected is included in a higher layer, inserts a multiplexing circuit as a copy of said flip-flop in between said flip-flop and said branched and connected circuit, as well as shifts the position of said boundary of said layer blocks to an output of said multiplexing circuit and changes the position of said branch to an input of said flip-flop.

6. The integrated circuit hierarchical design system as set forth in claim 1, comprising:
a multiplexing unit inserting a copy of a circuit,
wherein, when a flip-flop on the side of a direction opposite to a signal propagation direction included in a lower layer is connected to other flip-flop through a plurality of circuits comprising the circuit and a branching circuit which is branched at an output and is connected to at least one circuit in a higher layer, the multiplexing unit inserts a multiplexing circuit as a copy of said branching circuit in between said input of the branching circuit and said circuit of the higher layer, and shifts the position of said layer section to an input of said multiplexing circuit.

7. An integrated circuit hierarchical design program executed on a computer to execute verification of propagation delays in an integrated circuit which is formed of a plurality of layer blocks, which executes:
a function of shifting a boundary of said layer blocks so that each circuit through which a signal path passes is included in one layer block, wherein the signal path is a signal path that passes through each circuit in said plurality of layers and connects between two flip-flops,
a function of executing verification of propagation delays of each of said circuit in said one layer block, and
a function of, when a flip-flop, on the side of a direction opposite to a signal propagation direction, included in a lower layer is connected to another flip-flop through a plurality of circuits other than the circuit located between said flip-flops, to include both said plurality of circuits and said flip-flops in said lower layer and include a circuit which is branched from an output of any one of said plurality of circuits and connected in a higher layer, inserting a multiplexing circuit as a copy of said one circuit between said flip-flops in between said one circuit and said branched and connected circuit, as well as shifts in the position of said boundary of said layer blocks to an input of said multiplexing circuit and
changing the position of said branch to an input of said one circuit.

8. The integrated circuit hierarchical design program as set forth in claim 7, further comprising:
a function of inserting a buffer circuit which stores a name of said circuit or a position of said circuit in the layer at an input of said circuit when said circuit is a flip-flop.

9. The integrated circuit hierarchical design program as set forth in claim 7, further comprising:
a function of shifting a boundary of said layer blocks positioned on the side of a direction opposite to a signal propagation direction on the circuit locating between said flip-flops to a vicinity of an output of a flip-flop arranged on said opposite direction side.

10. The integrated circuit hierarchical design program as set forth in claim 9, further comprising:
a function of shifting a boundary of said layer blocks positioned on the signal propagation direction side on said circuit to a vicinity of an input of a flip-flop arranged on said signal propagation direction side.

11. The integrated circuit hierarchical design program as set forth in claim 7, further comprising:
a function of, when a circuit which is branched from an output of said flip-flop and connected is included in a higher layer, inserting a multiplexing circuit as a copy of said flip-flop in between said flip-flop and said branched and connected circuit, as well as shifting the position of said boundary of said layer blocks to an output of said multiplexing circuit and changing the position of said branch to an input of said flip-flop.

12. An integrated circuit hierarchical design method of executing verification of propagation delays in an integrated circuit which is formed of a plurality of layer blocks, comprising:

shifting a boundary of said layer blocks so that each circuit through which a signal path passes is included in one layer block, wherein the signal path is a signal path that passes through each circuit in said plurality of layers and connects between two flip-flops, executing verification of propagation delays of each of said circuit in said one layer block, and when a flip-flop, on the side of a direction opposite to a signal propagation direction, included in a lower layer is connected to another flip-flop through a plurality of circuits other than the circuit located between said flip-flops, to include both said plurality of circuits and said flip-flops in said lower layer and include a circuit which is branched from an output of any one of said plurality of circuits and connected in a higher layer, inserting a multiplexing circuit as a copy of said one circuit between said flip-flops in between said one circuit and said branched and connected circuit, as well as shifts in the position of said boundary of said layer blocks to an input of said multiplexing circuit and changing the position of said branch to an input of said one circuit.

13. The integrated circuit hierarchical design method as set forth in claim 12, further comprising:

a buffer inserting step of inserting a buffer circuit which stores a name of said circuit or a position of said circuit in the layer at an input of said circuit when said circuit is a flip-flop.

14. The integrated circuit hierarchical design method as set forth in claim 12, further comprising:

shifting a boundary of said layer blocks located on the side of a direction opposite to a signal propagation direction to a vicinity of an output of a flip-flop arranged on said opposite direction side.

15. The integrated circuit hierarchical design method as set forth in claim 12, further comprising:

shifting a boundary of said layer blocks positioned on the side of a direction opposite to a signal propagation direction to a vicinity of an output of a flip-flop arranged on said opposite direction side, and shifting a boundary of said layer blocks positioned on the signal propagation direction side on said circuit to a vicinity of an input of a flip-flop arranged on said signal propagation direction side.

16. The integrated circuit hierarchical design method as set forth in claim 12, comprising the step of:

when a circuit which is branched from an output of said flip-flop and connected is included in said higher layer, inserting a multiplexing circuit as a copy of said flip-flop in between said flip-flop and said branched and connected circuit, as well as shifting the position of said boundary of said layer blocks to an output of said multiplexing circuit and changing the position of said branch to an input of said flip-flop.

17. A computer readable mediums storing instructions for integrated circuit hierarchical design, the instructions comprising:

obtaining an integrated circuit formed of a lower layer and a higher layer, the lower layers comprising flip flops positioned with the higher layer in between and further comprising at least one circuit, wherein on each intersection between the higher layer and the lower layer, a boundary is provided;

shifting at least one existing boundary on a position between the flip-flop and the circuit such that the at least one circuit is provided on same layer and such that the propagation delay is not divided in the integrated circuit;

when a flip-flop, on the side of a direction opposite to a signal propagation direction, included in a lower layer is connected to another flip-flop through a plurality of circuits other than the circuit located between said flip-flops, to include both said plurality of circuits and said flip-flops in said lower layer and include a circuit which is branched from an output of any one of said plurality of circuits and connected in a higher layer, inserting a multiplexing circuit as a copy of said one circuit between said flip-flops in between said one circuit and said branched and connected circuit, as well as shifts in the position of said boundary of said layer blocks to an input of said multiplexing circuit and changing the position of said branch to an input of said one circuit; and producing the integrated circuit based on the hierarchical design.

18. The computer readable medium according to claim 17, wherein the instructions further comprise:

inserting a copy of one of the at least one circuit when the circuit is a branching circuit at an output and is connected to at least one circuit in the another layer.

* * * * *